United States Patent
Yang et al.

(10) Patent No.: US 9,245,706 B2
(45) Date of Patent: *Jan. 26, 2016

(54) METHOD OF WRITING AND REPRODUCING MULTIMEDIA SERVICE BY USING TAG AND APPARATUS THEREFOR

(75) Inventors: Pil-Seung Yang, Suwon-si (KR);
Kuk-hyun Han, Suwon-si (KR);
Hark-Joon Kim, Suwon-si (KR);
Bo-hyun Kyung, Yongin-si (KR);
Myoung-soon Choi, Yongin-si (KR);
Dae-hyun Kim, Suwon-si (KR);
Sang-jun Han, Seoul (KR); Bo-mi Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/544,276

(22) Filed: Jul. 9, 2012

(65) Prior Publication Data
US 2012/0274454 A1  Nov. 1, 2012

Related U.S. Application Data

(63) Continuation of application No. 12/173,628, filed on Jul. 15, 2008, now Pat. No. 8,239,385.

(30) Foreign Application Priority Data

Nov. 21, 2007  (KR) ......................... 10-2007-0119303
Nov. 21, 2007  (KR) ......................... 10-2007-0119311

(51) Int. Cl.
*G06F 17/30* (2006.01)
*H01J 1/63* (2006.01)
(Continued)

(52) U.S. Cl.
CPC . *H01J 1/63* (2013.01); *C01B 33/26* (2013.01); *C01B 33/32* (2013.01);
(Continued)

(58) Field of Classification Search
USPC .................................. 707/705, 912; 235/375
See application file for complete search history.

(56) References Cited

U.S. PATENT DOCUMENTS 6,717,507 B1  4/2004  Bayley et al.
7,215,251 B2  5/2007  Hyde
(Continued)

FOREIGN PATENT DOCUMENTS

CN       1856092 A    11/2006
EP       1460573 A2    9/2004
(Continued)

OTHER PUBLICATIONS

Communication dated Nov. 23, 2012 issued by the State Intellectual Property Office of P.R. China in counterpart Chinese Patent Application No. 200810214493.3.
(Continued)

*Primary Examiner* — Hung Q Pham
(74) *Attorney, Agent, or Firm* — Sughrue Mion, PLLC (57) ABSTRACT

Provided are method and apparatus for writing and reproducing a multimedia service using a tag in order to provide an intuitive interface for a user using a multimedia service. The method includes selecting a multimedia service to be written; generating tag information identifying the selected multimedia service; and writing the generated tag information to a tag. Accordingly, multimedia service information and content information can be stored in a tag by being written to tag information using a common format, and thus the user can later execute a service operation by easily writing information of a desired service operation to a tag and then simply connecting the tag to a tag reading device.

14 Claims, 5 Drawing Sheets

(51) Int. Cl.
*C01B 33/26* (2006.01)
*C01B 33/32* (2006.01)
*C09K 11/77* (2006.01)
*H01J 61/44* (2006.01)

(52) U.S. Cl.
CPC ............ *C09K 11/7792* (2013.01); *H01J 61/44* (2013.01); *G06F 17/30017* (2013.01); *Y02B 20/181* (2013.01); *Y10S 707/913* (2013.01)

(56) References Cited

U.S. PATENT DOCUMENTS

| | | | |
|---|---|---|---|
| 7,606,557 B2 | 10/2009 | Park et al. | |
| 2003/0033296 A1 | 2/2003 | Rothmuller et al. | |
| 2005/0099318 A1 | 5/2005 | Gilfix et al. | |
| 2005/0229227 A1 | 10/2005 | Rogers | |
| 2006/0233519 A1 | 10/2006 | Narita | |
| 2008/0031271 A1 | 2/2008 | Maeda et al. | |
| 2008/0074266 A1* | 3/2008 | Ohashi et al. | 340/572.1 |
| 2009/0019487 A1* | 1/2009 | Kulas | 725/41 |
| 2009/0092374 A1* | 4/2009 | Kulas | 386/95 |
| 2012/0274454 A1 | 11/2012 | Yang et al. | |

FOREIGN PATENT DOCUMENTS

| | | |
|---|---|---|
| KR | 10-2000-0036690 A | 7/2000 |
| KR | 10-2004-0017368 A | 2/2004 |
| KR | 10-2006-0118933 A | 11/2006 |
| KR | 10-2007-0060925 A | 6/2007 |
| KR | 10-2009-0052683 A | 5/2009 |
| WO | 01/55922 A2 | 8/2001 |
| WO | 03/012722 A1 | 2/2003 |
| WO | 2005/081088 A1 | 9/2005 |

OTHER PUBLICATIONS

Communication, dated Jan. 13, 2014, issued by the European Patent Office in counterpart European Application No. 08 162 835.6.
Communication, dated Jan. 15, 2014, issued by the State Intellectual Property Office of the People's Republic of China in counterpart Chinese Application No. 200810214493.3.
Communication dated Apr. 18, 2014, issued by the Korean Intellectual Property Office in counterpart Korean Application No. 10-2007-0119303.
Communication dated Jun. 5, 2014, issued by the State Intellectual Property Office of the People's Republic of China in counterpart Chinese Application No. 200810214493.3.
Communication dated Sep. 24, 2014 issued by the State Intellectual Property Office of P.R. China in counterpart Chinese Patent Application No. 200810214493.3.
Communication issued on Mar. 1, 2012 by the Intellectual Property Office of the P.R. of China in the counterpart Chinese Patent Application No. 200810214493.3.
Communication dated Apr. 24, 2015, issued by the Korean Intellectual Property Office in counterpart Korean Application No. 10-2007-0119303.

* cited by examiner

METHOD OF WRITING AND REPRODUCING MULTIMEDIA SERVICE BY USING TAG AND APPARATUS THEREFOR

CROSS-REFERENCE TO RELATED PATENT APPLICATION

This application is a continuation application of U.S. application Ser. No. 12/173,628, filed Jul. 15, 2008, which claims the benefit of Korean Patent Application No. 10-2007-0119311, filed on Nov. 21, 2007 in the Korean Intellectual Property Office, the disclosure of which is incorporated herein in its entirety by reference.

BACKGROUND OF THE INVENTION

1. Field of the Invention

Methods and apparatuses consistent with the present invention relate to writing and reproducing a multimedia service using a tag, and more particularly, to a method and apparatus for writing and reproducing a multimedia service to provide an intuitive interface for a user using a tag when using multiple multimedia services.

2. Description of the Related Art

Recently, as multiple multimedia services are provided based on home networks, the consumer can use various kinds of content, such as home content, various broadcasting service data provided by external content providers, shared documents through web applications, content related to entertainment, personal homepages, etc.

Accordingly, a user interface method that enables a user to use the ever-increasing amount of content in an easy and tangible manner is needed.

Also, bar-codes as print tags, and integrated circuit (IC) chips or radio frequency identification (RFID) using wireless antennas as electronic tags are prevailing at gradually lower costs, and thus a more intuitive and easier multimedia service interface can be provided by using these tags.

SUMMARY OF THE INVENTION

The present invention provides a method and apparatus for writing multimedia service information and reproducing the corresponding multimedia service by using an electronic tag in order to provide an intuitive interface to a user when utilizing a multimedia service.

According to an aspect of the present invention, there is provided a method of writing multimedia service information by using a tag, the method comprising: selecting a multimedia service to be written; generating tag information which can identify the selected multimedia service; and writing the generated tag information to a tag.

The tag information may comprise type information of the tag, service information, and content information.

The type information may include a flag indicating whether the service information and the content information of the tag information are stored in the tag or in an external storage unit, and the service information includes content provider information or device information of the written multimedia service, and the content information includes content data corresponding to the written multimedia service or link information about the content data.

The service information and the content information may be stored in the external storage unit, wherein the writing the generated tag information, the service information and the content information are transmitted to the external storage unit, and an index value identifying the transmitted service information and the content information is stored in the tag.

The selected multimedia service may be home content that is reproduced in a predetermined reproduction device in a home network, wherein the generated tag information includes device information identifying the reproduction device and file information of the home content being reproduced.

The generated tag information may further include location information representing a reproduction location of the home content at the time when the tag information is being generated.

The selected multimedia service may be content received from an external content provider, wherein the generated tag information includes content provider information identifying the external content provider and link information of the received content.

The selected multimedia service may be a user authentication service, wherein the generated tag information includes identification information identifying a multimedia service that requires a user authentication, and user information.

According to another aspect of the present invention, there is provided a method of reproducing a multimedia service by reading a tag, the method comprising: reading tag information written to the tag; determining content of a written multimedia service based on the read tag information; and reproducing content corresponding to the read multimedia service.

The tag information may include type information of the tag, service information, and content information.

The type information may include a flag indicating whether the service information and the content information of the tag information written to the tag are stored in the tag or in an external storage unit; and the service information includes content provider information or device information of the written multimedia service; and the content information includes content data corresponding to the written multimedia service or link information about the content data.

The service information and the content information may be stored in the external storage unit based on the value of a flag included in the tag information, wherein the reading tag information, the service information and the content information are received from the external storage unit by using an index value stored in the tag.

When the determined multimedia service is home content that is reproduced in a predetermined reproduction device in a home network, in the reproducing content, the home content may be reproduced based on device information identifying the reproduction device and file information of the home content included in the tag information.

In the reproducing content, the home content may be consecutively reproduced based on location information representing the reproduction location of the home content at the time when the tag information is being generated.

When the determined multimedia service is content information that is received from an external content provider, the reproducing content may further comprise receiving the content data from the external content provider based on content provider information identifying the external content provider and link information of the content data.

When the determined multimedia service is a seamless service between a first device and a second device, in the reproducing content, content being reproduced in the first device may be reproduced in the second device.

When the determined multimedia service is a user authentication service, in the reproducing content, user authentication may be performed based on identification information identifying a multimedia service that requires user authentication and user information.

When the determined multimedia service is identification information of a business card or an advertisement leaflet, the reproducing content may further comprise receiving content about the business card or the advertisement leaflet based on the link information included in the tag information of the business card or the advertisement leaflet.

According to another aspect of the present invention, there is provided an apparatus for writing multimedia service information by using a tag, comprising: a selecting unit selecting a multimedia service to be written; a tag information generating unit generating tag information which can identify the selected multimedia service; and a tag writing unit writing the generated tag information to the tag.

According to another aspect of the present invention, there is provided an apparatus for controlling reproducing a multimedia service by reading a tag, comprising: a tag reading unit reading tag information written to the tag; a determining unit determining content of a written multimedia service based on the read tag information; and a control unit controlling reproduction so that content corresponding to the determined multimedia service is reproduced.

In addition, the present invention may include a computer readable recording medium on which a computer program for executing the method of writing and reproducing multimedia service information by using a tag is recorded.

BRIEF DESCRIPTION OF THE DRAWINGS

The above and other features and of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1:
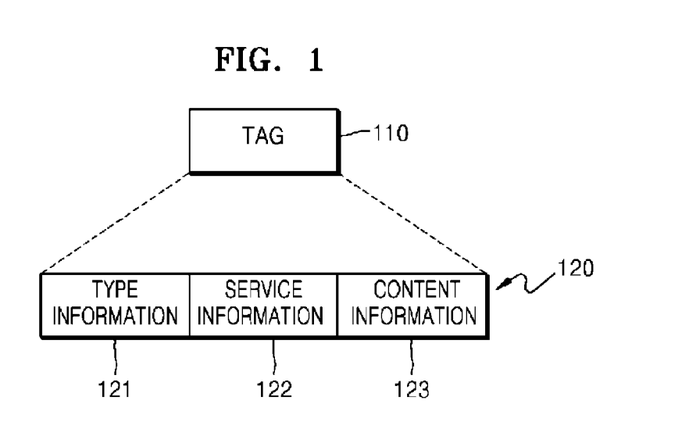
FIG. 1 is a data structure illustrating a format of tag information according to an embodiment of the present invention.

FIG. 1 is a data structure illustrating a format of tag information according to an embodiment of the present invention.

Referring to FIG. 1, tag information 120 stored in a tag 110 includes type information 121 of the tag 110, service information 122, and content information 123.

The type information 121 is a data field to which several information data relating to the tag itself is written, and includes at least one of a flag representing direct/indirect mode (direct_flag), a tag mode according to the type of service and content, an expiration date denoting the lifetime of the tag information 120, and version information.

The service information 122 is information of service program information to be provided, and may include an ID of a device, an address (or ID) of a server or a hub-site, identification information of a service provider, the type of web content, a web application, user information, an ID of a business card or advertisement leaflet.

The content information 123 is content data of a service to be provided or information such as an ID of content, a uniform resource location (URL), a title of the content data, etc., as link information of the content data.

Figure 2:
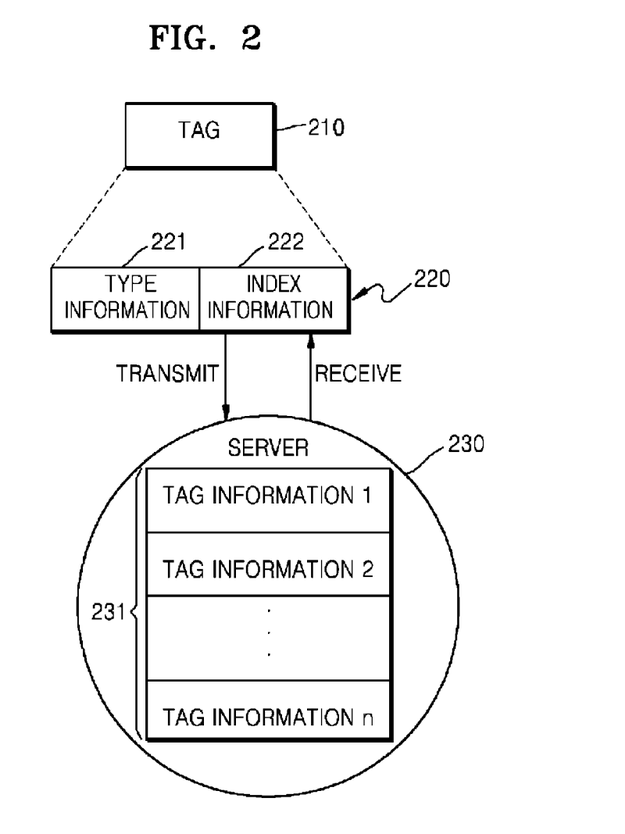
FIG. 2 illustrates tag information including an index value according to another embodiment of the present invention.

FIG. 2 illustrates tag information 220 including an index value according to another embodiment of the present invention.

Referring to FIG. 2, the tag information 220 stored in a tag 210 may include type information 221 and index information 222.

The flag (i.e., direct_flag) denoting direct/indirect mode described with reference to FIG. 1 indicates whether the service information 122 and the content information 123 of the tag information 120 are stored in the tag 110 or an external storage unit (e.g., an interface device or server).

For example, in FIG. 2 when data is stored in an external storage unit such as a server 230, the index information 222 corresponding to the tag information 220 of a tag information list 231 included in the server 230 is transmitted so as to be stored in the tag information 220.

The index information 222 is used because the capacity allocated for the tag 210 is limited, usually to 96 bits, or because an external storage unit is used to ensure the security of stored data. This is called an indirect mode.

Of course, if there is no limitation in capacity or security problem, then the tag 210 may store all information (i.e., direct mode), and a same multimedia service can be utilized anytime when there is a reader to read the tag 210.

When tag information is generated and stored in a tag, whether to use the direct mode or indirect mode can be determined by a user or by an apparatus automatically.

Figure 3:
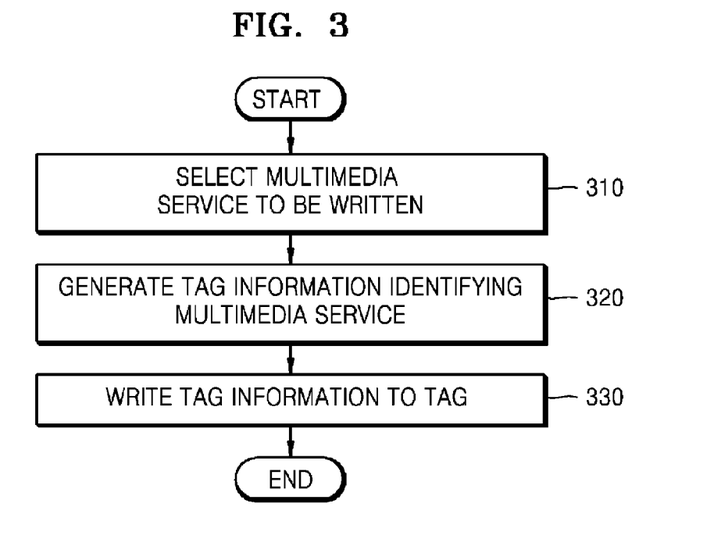
FIG. 3 is a flowchart illustrating a method of writing multimedia service information by using a tag according to an embodiment of the present invention.

FIG. 3 is a flowchart illustrating a method of writing multimedia service information using a tag according to an embodiment of the present invention.

Referring to FIG. 3, a method of writing using a tag includes selecting a multimedia service to be written (operation 310) and generating tag information which can identify the selected multimedia service (operation 320), and writing the generated tag information to the tag (operation 330).

The writing method using a tag will be described with reference to FIG. 5.

Figure 5:
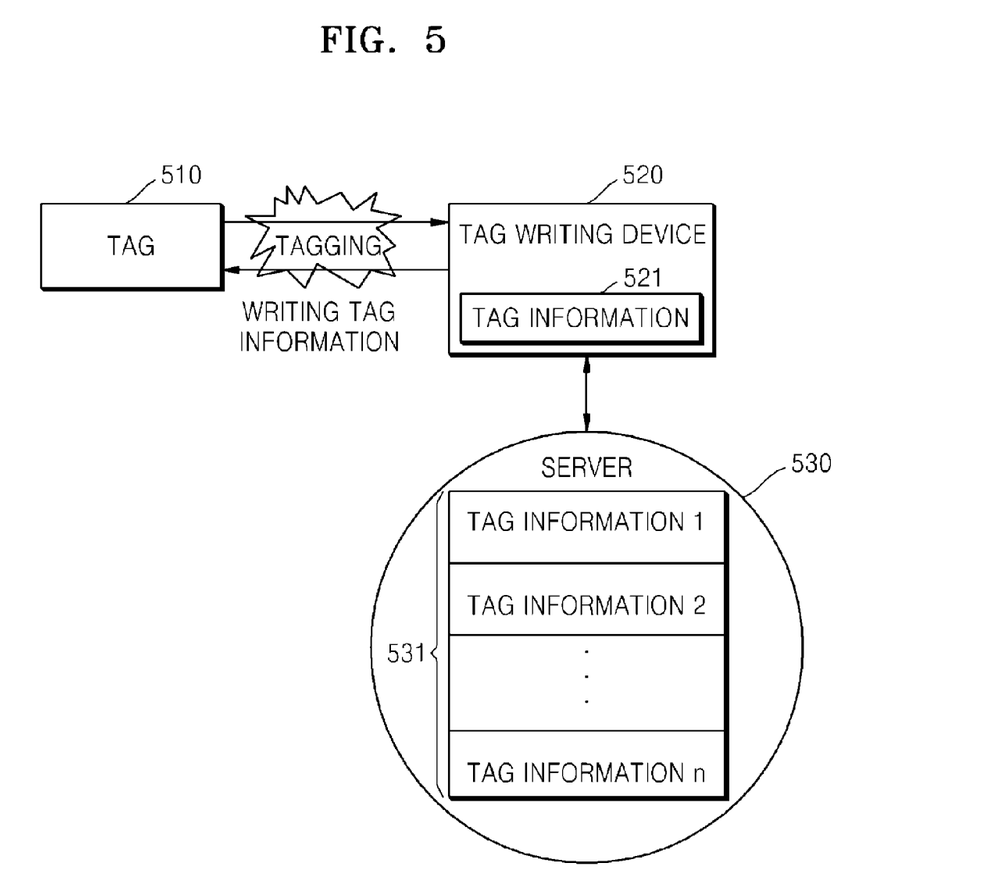
FIG. 5 illustrates a process of writing tag information to a tag according to the writing method of FIG. 3.

FIG. 5 illustrates a process of writing tag information of a tag according to the writing method of FIG. 3.

First, an electronic tag 510 is connected to an interface device 520 in which an apparatus for writing a tag is mounted. The interface device 520 will be referred to as a tag writing device 520 hereinafter. The operation of connecting a tag to the tag writing device 520 will be referred to as tagging. Tagging does not require connecting to the tag writing device 520 via physical connection, and a wireless connection by using radio frequency identification (RFID) is also possible.

The tag writing device 520 recognizes the tagging with the tag 510 and sets an operation to be written. That is, tag information 521 is generated to write the current status of the operation at the time when the multimedia service is being operated.

The generated tag information 521 includes type information, service information, and content information as described above, and may be written to an external storage unit (e.g., external server) instead of the tag 510 due to the problem of the capacity or security. In this case, the tag 510 obtains index information to search corresponding service information and content information later from the external storage.

For example, when writing data that is larger than available capacity of the tag 510, the tag information can be stored in a predetermined server or hub-site. In this case, a server 530 manages various tag information in the form of list (i.e., tag information list 531).

In terms of security problem, in order that the multimedia service written in the tag can be operated only via the corresponding tag writing device 520 (when a tag reading device is mounted in the tag writing device 520), service information and content information among the generated tag information 521 can be stored in the tag writing device 520. Accordingly, the user cannot control to reproduce the corresponding content via another tag reading device using the tag 510 but only via a predetermined tag reading device which stores the tag information 521.

Finally, the generated tag information 521 is written to the tag 510. That is, in a direct mode, tag information having a data structure described with reference to FIG. 1 is written to a tag, and in an indirect mode, tag information having a data structure described with reference to FIG. 2 is written to a tag.

There can be several embodiments implementing the above described method of writing multimedia service information by using a tag as follows.

First, in a home network when home content is reproduced in a content playback device such as a TV, computer, DVD player, and so forth, that is, when a selected multimedia service is home content, and when the operation of writing tag information described with reference to FIG. 5 is performed, device information identifying the reproduction device and file information of the home content being reproduced are comprised in the generated tag information. For example, when a movie is being reproduced in a computer when connecting with a tag, then the ID of the computer, the file path of the movie content, and the name of the file, and so forth are written to the tag. Accordingly, the user can reproduce the same movie by connecting the tag to a reading device later.

Moreover, in the case of the reproducing a video or audio file, the reproduction location of the content at the time of connecting with the tag can also be written, and thus continuous playback from the previous reproduction location (i.e., the playback location) is possible.

According to another embodiment, when content is provided by an external content provider via a broadcasting network or Internet, the information written to a tag includes content provider information identifying the external content provider and link information of the received content. That is, for example, when a list of latest pop songs is being downloaded via a predetermined broadcasting channel, the content provider information of the broadcasting channel and the link information of the list of latest pop songs, are written to a tag. Accordingly, the user can download the same content again using the tag, and can also receive the real-time content at the time when the multimedia service is being reproduced again. Similarly, an Internet function for bookmarking favorite websites can be performed using the above tag.

According to another embodiment of the present invention, the method of writing multimedia service information by a tag can be used to provide a user authentication service. By writing user authentication information to a tag in advance, which is required in order to use a predetermined multimedia service, a user authentication service can be performed by using the tag. To this end, identification information identifying services that require user authentication and user information are written to a tag.

Figure 4:
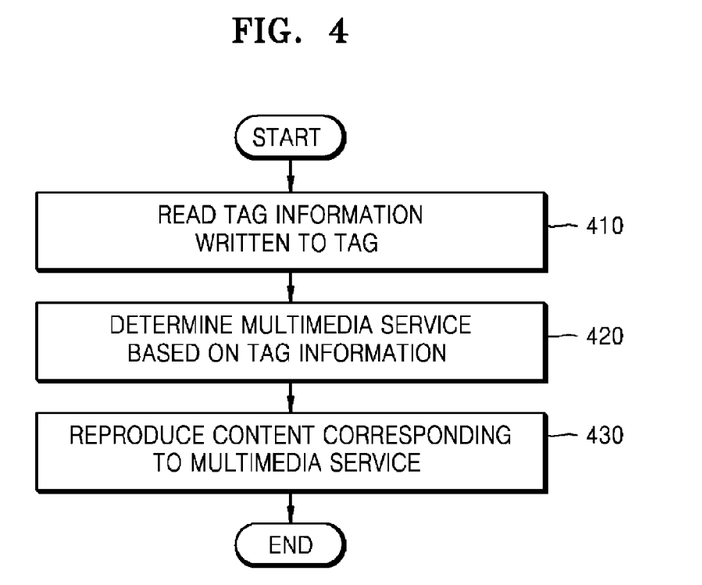
FIG. 4 is a flowchart illustrating a method of reproducing a multimedia service by reading a tag according to another embodiment of the present invention.

FIG. 4 is a flowchart illustrating a method of reproducing a multimedia service by reading a tag according to another embodiment of the present invention.

Referring to FIG. 4, the method of reproducing a multimedia service by using a tag includes reading tag information written to the tag (operation 410), determining a multimedia service that is written to the tag based on the read tag information (operation 420), and reproducing content corresponding to the determined multimedia service (operation 430).

Hereinafter, the method of reproducing a multimedia service by using a tag will be described with reference to FIG. 6.

Figure 6:
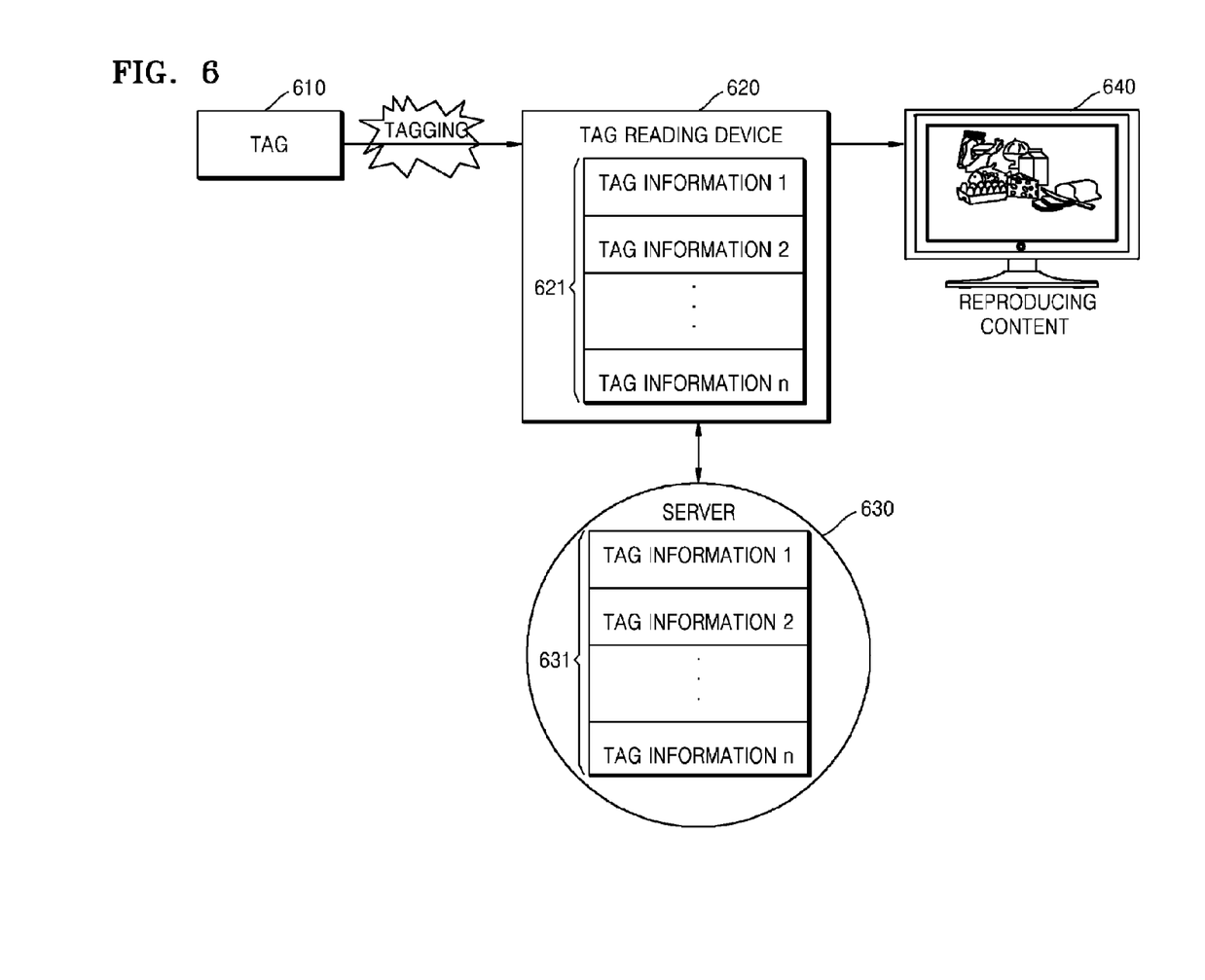
FIG. 6 illustrates a process of reproducing a multimedia service by reading tag information of a tag according to the reproduction method of FIG. 4.

FIG. 6 illustrates a process of reproducing a multimedia service by reading tag information of a tag according to the reproduction method of FIG. 4.

First, an electronic tag 610 is connected to an interface device 620 in which an apparatus for reading a tag is mounted. The interface device 620 will be referred to as a tag reading device 620, hereinafter. The operation of connecting the tag 610 to the tag reading device 620 is referred to as tagging, as described above. Here, also, tagging does not have to be via a physical connection, and a wireless connection by using RFID is also possible as described above.

The tag reading device 620 recognizes the tagging with the tag 610 and reads tag information written to the tag 610. As described above, tag information includes type information, service information, and content information.

Then an operation to be reproduced is determined. The tag reading device 620 first determines the direct/indirect mode of the tag information. Accordingly, in a direct mode, service information and content information written to the tag information are executed, and in an indirect mode, searching is performed. In other words, in the indirect mode when service information and content information of the tag information are stored in an external storage unit due to the capacity or security problem, searching is performed by using an index value written to the tag.

In the indirect mode, a tag information list 621 in the tag reading device 620 is searched first, and if there is no information matched with the index value in the tag reading device 620, an external server 630 is connected to search a tag information list 631. When the server 630 finds tag information corresponding to the index value, transmits the corresponding tag information to the tag reading device 620.

The tag reading device 620 interprets the received tag information and performs a control operation so that a playback device corresponding to the written multimedia service reproduces the content.

There can be several embodiments implementing the above described method of reproducing a multimedia service by using a tag as follows.

According to an embodiment of the present invention, if the determined multimedia service is a seamless service between a first device and a second device, content such as a movie, music, etc. being reproduced in the first device can be reproduced in the second device without being stopped. That is, when the first device, for example, a PMP, in which the tag 610 is mounted, is connected to the tag reading device 620, a video/audio file being reproduced in the first device (PMP)

can be reproduced in the second device, for example, a TV seamlessly. The opposite case is also possible.

According to another embodiment, when the determined multimedia service is identification information of a business card or advertisement leaflet, content about the business card or advertisement leaflet can be received based on link information included in the tag information of tags attached to the business card or the advertisement leaflet. In other words, content such as a homepage of a company related to the business card or a promotion website related to the advertisement leaflet can be received.

Figure 7:
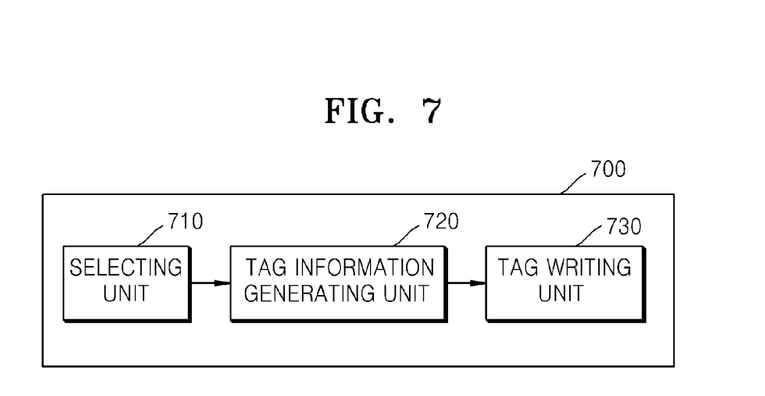
FIG. 7 illustrates an apparatus for writing multimedia service information by using a tag according to another embodiment of the present invention.
Figure 8:
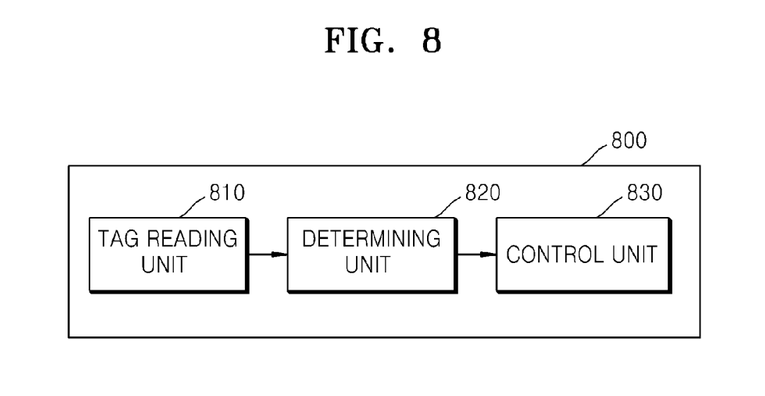
FIG. 8 illustrates an apparatus for reproducing a multimedia service by reading a tag according to another embodiment of the present invention.

FIG. 7 illustrates an apparatus 700 for writing multimedia service information by using a tag according to another embodiment of the present invention. FIG. 8 illustrates an apparatus 800 for controlling the reproduction of a multimedia service by reading a tag according to another embodiment of the present invention.

Referring to FIG. 7, the apparatus 700 for writing multimedia service information by using a tag includes a selecting unit 710 selecting a multimedia service to be written, a tag information generating unit 720 generating tag information identifying the selected multimedia service, and a tag writing unit 730 writing the generated tag information to the tag.

Meanwhile, referring to FIG. 8, the apparatus 800 for controlling to reproduce a multimedia service by reading a tag may include a reading unit 810 reading tag information written to the tag, a determining unit 820 determining the multimedia service written to the read tag information, and a controlling unit 830 performing a control operation so that content corresponding to the determined multimedia service is reproduced in a playback device.

The above described method of writing multimedia service information by using a tag and reproducing the corresponding multimedia service by reading the tag according to embodiments of the present invention can be written as computer programs and can be implemented in general-use digital computers that execute the programs using a computer readable recording medium.

Also, as described above, the data structure of the tag information used in the present invention can be written to a computer readable recording medium by using various means.

Examples of the computer readable recording medium include magnetic storage media (e.g., ROM, floppy disks, hard disks, etc.) and optical recording media (e.g., CD-ROMs, or DVDs). In another embodiment the computer readable recording medium may include storage media such as carrier waves (e.g., transmission through the Internet).

According to the method of writing and reproducing a multimedia service by using a tag and the apparatus thereof according to the present invention, multimedia service information and content information can be stored to a tag by using a common format, and thus the user can later execute a service operation by easily writing information of a desired service operation to a tag and then simply connecting the tag to a tag reading device.

In addition, since the tag can be directly generated and written, a corresponding multimedia service can be used anywhere there is a reading device, thus overcoming space limitations.

While this invention has been particularly shown and described with reference to preferred embodiments thereof, it will be understood by those of ordinary skill in the art that various changes in form and details may be made therein without departing from the spirit and scope of the invention as defined by the appended claims. The preferred embodiments should be considered in a descriptive sense only and not for purposes of limitation. Therefore, the scope of the invention is defined not by the detailed description of the invention but by the appended claims, and all differences within the scope will be construed as being included in the present invention.

What is claimed is:

1. An apparatus for controlling reproducing a content, comprising:
   a tag reading unit including program logic that is configured to read tag information indicating a playback location of the content from a tag of a first external display device in response to detecting the tag of the first external display device, the playback location indicating a current reproduction location in the content by the first external display device when the tag information is generated in the first external display device; and
   a control unit including program logic that is configured to control a second external display device to reproduce the content starting from the playback location,
   wherein at least one of the tag reading unit and the control unit is implemented as a hardware component,
   wherein the tag is an electronic tag comprising an integrated circuit (IC) chip.

2. The apparatus of claim 1, wherein the tag information comprises identification information of the content, and the control unit controls the second external display device to obtain the content using the identification information.

3. The apparatus of claim 1, wherein the tag information comprises address information of the content, and the control unit controls the second external display device to download the content from a server using the address information.

4. The apparatus of claim 1, wherein the first external display device is identified by device information included in the tag information.

5. An apparatus capable of writing content information, comprising:
   a display unit to display content;
   a tag information generating unit including program logic configured to generate tag information indicating a playback location of the content being currently displayed on the display unit, the playback location indicating a current reproduction location in the content when the tag information is generated; and
   a tag writing unit including program logic configured to write the tag information in a tag in a predefined format such that an external display device can reproduce the content starting from the playback location,
   wherein at least one of the tag information generating unit and the tag writing unit is implemented as a hardware component,
   wherein the tag is an electronic tag comprising an IC chip.

6. The apparatus of claim 5, wherein the tag information comprises identification information of the content.

7. The apparatus of claim 5, wherein the tag information comprises address information of the content.

8. The method of claim 5, wherein the display unit is identified by device information included in the tag information.

9. A method for controlling reproducing a content in an apparatus, comprising:
   reading tag information indicating a playback location of the content from a tag of a first external display device in response to detecting the tag of the first external display device, the playback location indicating a current reproduction location in the content by the first external display device when the tag information is generated in the first external display device; and controlling a second external display device to reproduce the content starting from the playback location, wherein the tag is an electronic tag comprising an IC chip.

10. The method of claim 9, wherein the tag information comprises identification information of the content, and the method further comprises controlling the second external display device to obtain the content using the identification information.

11. The method of claim 9, wherein the tag information comprises address information of the content, and the method further comprises controlling the second external display device to download the content from a server using the address information.

12. A method for writing content information in an apparatus, comprising:

displaying content on a display unit;

generating tag information indicating a playback location of the content being currently displayed on the display unit, the playback location indicating a current reproduction location in the content when the tag information is generated;

writing the tag information in a tag in a predefined format such that an external display device can reproduce the content starting from the playback location, wherein the tag is an electronic tag comprising an IC chip.

13. The method of claim 12, wherein the tag information comprises identification information of the content.

14. The method of claim 12, wherein the tag information comprises address information of the content.

* * * * *